United States Patent [19]

Saji et al.

[11] Patent Number: 4,803,452
[45] Date of Patent: Feb. 7, 1989

[54] SUPERCONDUCTOR FOR MAGNETIC FIELD SHIELDING

[75] Inventors: Yoshiro Saji, 7-6 Satakedai 5-chome, Suita-shi, Osaka; Eichi Tada, Kobe; Hiroaki Toda, Shiki; Yoshiaki Kawahara, Himeji, all of Japan

[73] Assignees: Yoshiro Saji; Koatsu Gas Co., Ltd., both of Osaka, Japan

[21] Appl. No.: 139,604

[22] Filed: Dec. 29, 1987

Related U.S. Application Data

[63] Continuation-in-part of Ser. No. 826,291, Feb. 5, 1986, abandoned.

[30] Foreign Application Priority Data

Feb. 8, 1985 [JP] Japan .................................. 60-24254

[51] Int. Cl.$^4$ .............................................. H01F 7/00
[52] U.S. Cl. ..................................... 335/301; 351/216; 428/930
[58] Field of Search ................... 335/216, 301; 174/35; 336/DIG. 1; 427/62, 63; 428/622, 651, 674, 930

[56] References Cited

U.S. PATENT DOCUMENTS

| | | | |
|---|---|---|---|
| 3,205,461 | 9/1965 | Anderson | 335/216 |
| 3,281,738 | 10/1966 | Hanak | 335/216 |
| 3,309,179 | 3/1967 | Fairbanks | 428/930 X |
| 3,331,041 | 7/1967 | Bogner | 335/216 |
| 3,352,008 | 11/1967 | Fairbanks | 335/216 |
| 3,397,084 | 8/1968 | Krieglstein | 335/216 X |
| 3,440,366 | 4/1969 | Bogner | 428/930 X |
| 3,449,092 | 6/1969 | Hammond | 427/63 X |
| 3,458,293 | 7/1969 | Schindler | 428/930 X |
| 3,674,553 | 7/1972 | Tachikawa et al. | 427/62 |
| 4,151,329 | 4/1979 | Sigsbee | 428/930 X |

FOREIGN PATENT DOCUMENTS 2608089 1/1977 Fed. Rep. of Germany ........ 427/62

Primary Examiner—George Harris
Attorney, Agent, or Firm—Koda and Androlia

[57] ABSTRACT

A magnetic field shield which is characterized in that it includes at least one composite lamination including a thin film of the superconductor and a metal layer laminated with the thin film of the superconductor having a thickness not more than that obtained at the turning point where the magnetic field shielding effect of a single film of the superconductor changes from an abrupt increase to a gradual increase and the film thickness is less than 2 μm.

13 Claims, 3 Drawing Sheets

SUPERCONDUCTOR FOR MAGNETIC FIELD SHIELDING

This is a continuation-in-part of application Ser. No. 826,291, filed Feb. 5, 1986 now abandoned.

BACKGROUND OF THE INVENTION

1. Field of the Invention

The present invention relates to a superconductor for magnetic field shielding which shields magnetic fields using superconductors.

2. Prior Art

As a magnetic field shielding using superconductivity the first class superconductor as type I or the second class superconductor as type II has been used depending on the intensity of a magnetic field. The superconductor for magnetic field shielding comprising the first class superconductor uses perfect diamagnetism (Meissner effect), a property of superconductivity. The superconductor cannot shield intense magnetic fields since its critical magnetic flux density is low. The superconductor for magnetic field shielding comprising the second class superconductor utilizes a mixture of the superconductor state and the normal conduction state, and its critical magnetic field is separated into the upper and lower critical magnetic flux densities. Since the upper critical magnetic flux density is extremely high, the superconductor comprising the second class superconductor can be used to shield intense magnetic fields. Since such a superconductor is thicker, its shielding effect increases. Therefore, a thick superconductor is used to shield intense magnetic fields. However, due to local flux flow such a thick superconductor may generate heat, resulting in reduced shielding effect and secondary harmful effects. Accordingly, when the above-mentioned second class superconductor is used to shield intense magnetic fields, relatively thick sheets or tapes of the superconductor are laminated in many layers or alternately laminated with aluminum or copper sheets. Since these two laminated types are thick and weighty when they are made to shield intense magnetic fields, they are not satisfactory in practical use.

Furthermore, the former laminated type is low in stability since it easily causes flux jumping (magnetic fluxes enter and move into the central section of the superconductor increasing the temperature of the superconductor and causing a catastrophic phenomenon of the entry of more flux) due to quick excitation even in weak magnetic fields. The latter laminated type has a better construction than the former one since aluminum or copper sheets are effective in cooling. Nevertheless, the characteristics of the superconductor are not fully realized even when the construction of the latter type is used. Moreover, since it was understood that a higher shielding effect was obtained from a thicker superconductor (the thickness of the superconductor was thought to be proportional to the magnetic field shielding effect), a thick superconductor was thought to be more advantageous than laminated thin superconductor layers to reduce production cost and production processes provided that a means for preventing the above-mentioned heat generation was taken.

SUMMARY OF THE INVENTION

It is therefore an object of the present invention to provide a superconductor for magnetic field shielding comprising the second class superconductor as type II.

The inventors of the present invention found the following two new facts after researching the basic characteristics of the above-mentioned superconductor to obtain light and stable magnetic field shieldings. The first fact is that the superconductor for magnetic field shielding effect abruptly increases from the vicinity of origin to a turning point of a graph illustrating the relationship between the thickness of a single layer of the superconductor film and the magnetic shielding effect of the superconductor film and after the turning point gradually increases as the thickness of the superconductor film increases. The second fact is that the magnetic field shielding effect is proportional to the number of layers of the superconductor films when the superconductor comprises a plurality of identical layers each of which has an identical thickness. In other words, the magnetic field shielding effect of the entire superconductor is the effect of a single layer times the number of layers. Based on the above-mentioned discoveries, the present invention can provide a completely innovative superconductor for magnetic field shielding which is very light, stable and useful by fully utilizing the characteristics of a superconductor film.

DETAILED DESCRIPTION OF THE INVENTION

Figure 1:
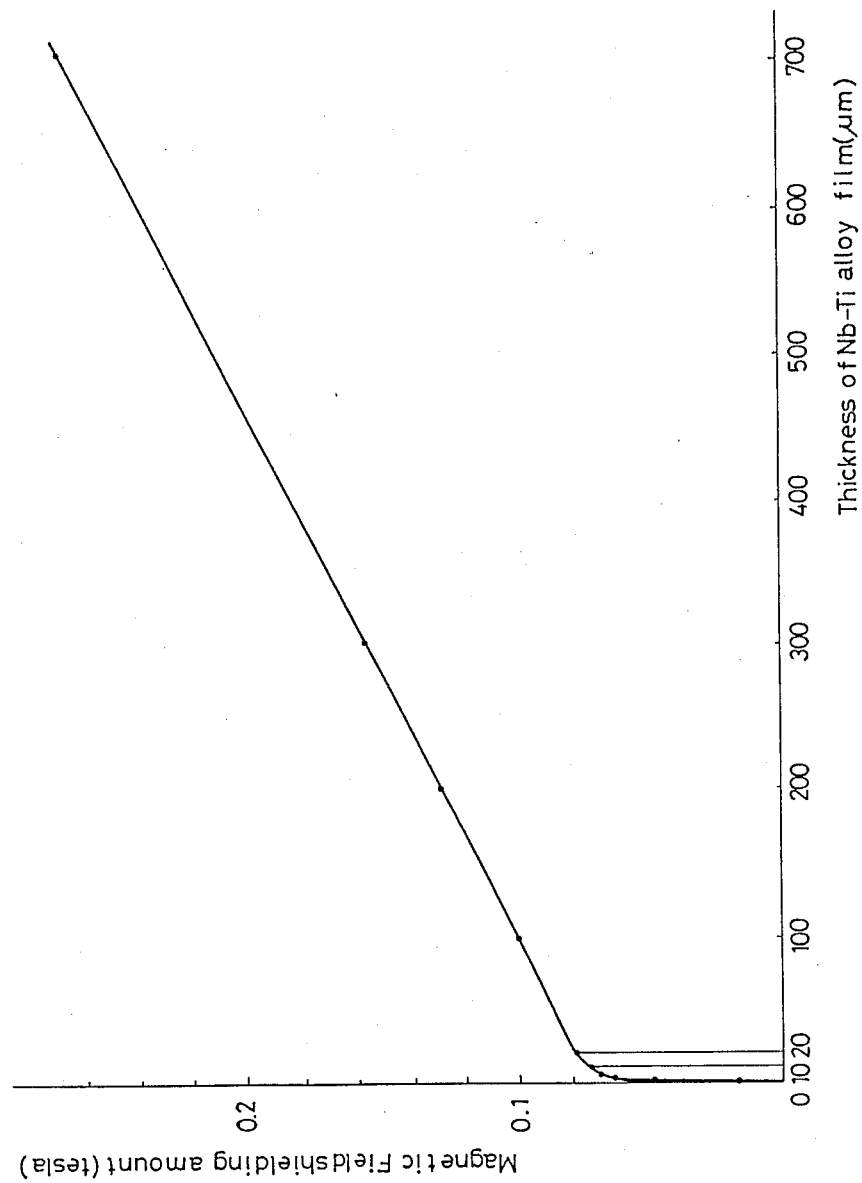
FIG. 1 is a graph illustrating the relationship between the thickness of a Nb—Ti alloy film and its magnetic field shielding effect.

The superconductor for magnetic field shielding of the present invention includes a superconductor film having the above-mentioned characteristic curve between the thickness of a single layer of the superconductor film and the magnetic field shielding effect of the superconductor film.

The superconductor for magnetic field shielding is characterized in that it comprises at least one layer of a composite lamination comprising a thin film of the superconductor and a metal layer (foil, sheet or film) laminated with the thin film of the superconductor having a thickness not more than that obtained at the turning point of the curve where the magnetic field shielding effect of the superconductor film changes from an abrupt increase to a gradual increase as described above. Superconductors such as niobium, niobium alloy, niobium compound and vanadium compound are used as the above-mentioned superconductor materials. More specifically, Nb, Nb—Ti, Nb—Zr, NbN Tin, NbN, NBC, $Nb_3$, Sn, Nb Al, $Nb_33Ga$, $Nb_3$ Ge and $V_3Ga$ are used. These come under the catagory of the second class superconductor and has the above-mentioned characteristics. In the actual practice, however, Nb—Ti is the best suited. Although high-purity aluminum or copper is the best suited for the metal layer to be laminated with the superconductor films, low-purity aluminum, copper or other metals can also be used.

The composite lamination of superconducting films and metal layers is made by forming a thin superconductor film on each metal layer using thin-film forming techniques such as sputtering, or by closely contacting a separately prepared superconductor film to each metal layer by ultrasonic soldering, or by simply laminating a film on each metal layer. The thickness of the superconductor film must be not more than the thickness obtained at the above-mentioned turning point of the graph illustrating the above-mentioned relationship between the thickness of the superconductor film and the magnetic field shielding effect. If the film thickness exceeds the thickness obtained at the turning point, the significant shielding effect of the present invention described later does not tend to be achieved. The superconductor for field shielding of the present invention can be obtained by using a single or a plurality of the above-mentioned composite laminations depending on the intensity of the magnetic field to be shielded. A plurality of the composite layers are made by alternately laminating the superconductor films on the metal layers.

The functions of the superconductor for magnetic field shielding of the present invention are described below referring to the drawings of the embodiments as explained before.

FIG. 1 is a graph illustrating the relationship between the thickness of a Nb—Ti alloy film (Nb 50%, Ti 50% in weight) and the magnetic field shielding effect of the film. The axis of abscissa represents the thickness (unit: $\mu$m) of the Nb—Ti alloy film and the axis of ordinate represents the magnetic flux shielding amount (unit: Tesla) of the film respectively. According to FIG. 1, the magnetic flux shielding amount, i.e., magnetic flux shielding effect abruptly increases as the thickness of the Nb—Ti alloy film increases from nearly zero (the origin) to approximately 20 $\mu$m (mostly 10 $\mu$m), and thereafter the effect gradually increases with an easy gradient if the thickness exceeds 20 $\mu$m.

When a magnetic field was shielded by a superconductor film of this kind in the prior art, a relatively thick superconductor film of 100 to 500$\mu$ was conventionally used as described before, and it was understood that the thickness of the superconductor film was proportional to the magnetic flux shielding effect of the superconductor film.

Figure 2:
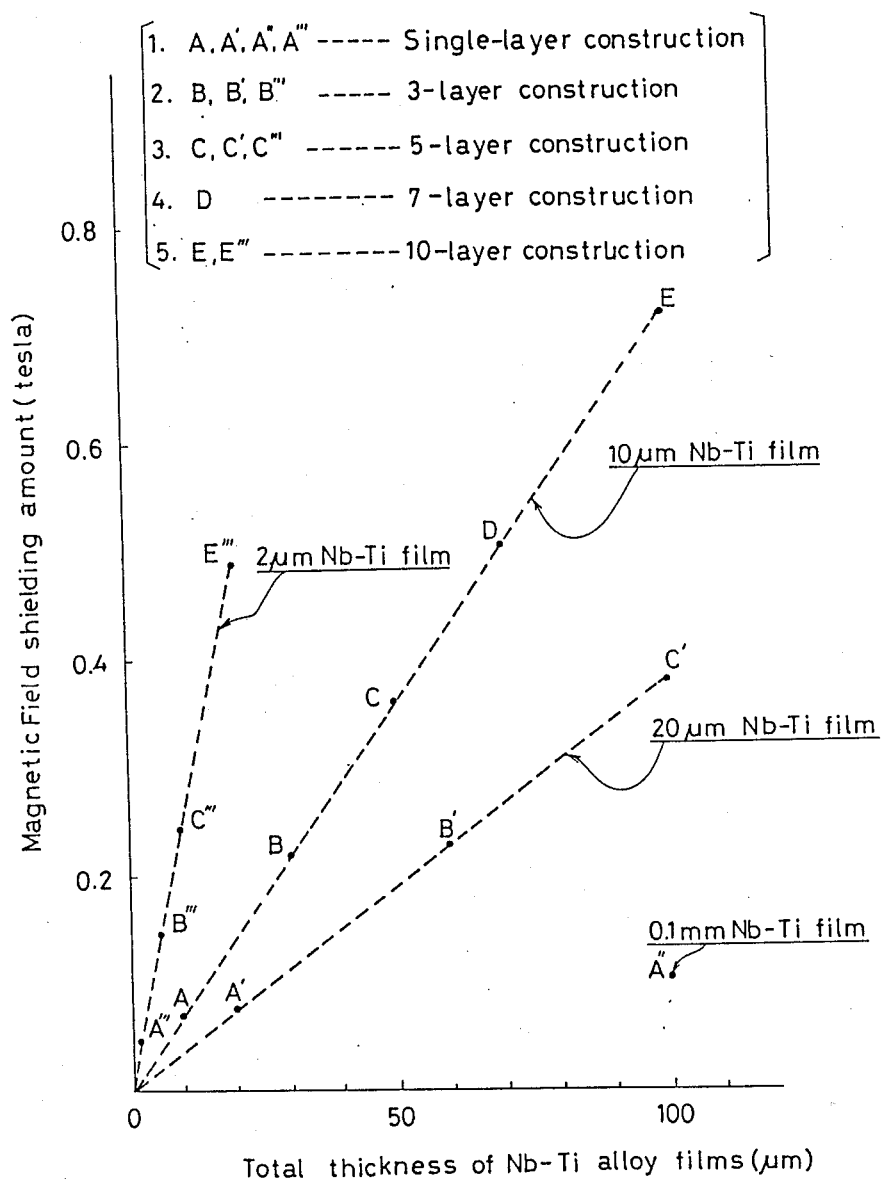
FIG. 2 is a graph illustrating the relationship between the total thickness of the Nb—Ti alloy films (lamination effect) and their magnetic field shielding effect.

Accordingly, the magnetic flux shielding effect of the superconductor film having a thickness not more than 20$\mu$ was estimated by calculation on the basis of the measurement values obtained from a superconductor film having a thickness between 100 and 500 $\mu$m. However, once it is discovered that the magnetic flux shielding effect of a superconductor film has the characteristic shown in FIG. 1, it is obvious that the magnetic flux shielding effect of a superconductor film having a thickness of not more than 20 $\mu$m is far greater than the conventionally estimated value. Therefore, even a thin superconductor film can be used as a superconductor for magnetic field shielding depending on the intensity of a magnetic field (terrestrial magnetic field for example). Furthermore, according to another experiment conducted by the inventors of the present invention, the magnetic field shielding effect of the multilayers of superconductor films, each of which has an identical thickness, is proportional to the number of layers (as shown in FIG. 2).

Consequently, according to FIG. 1 it is understood that the magnetic field shielding effect of the multilayers of Nb—Ti films, each of which has a thickness of not more than 20 $\mu$m, is far greater than that of the multilayers of Nb—Ti films, each of which has a thickness of more than 20 $\mu$m, provided that the total thickness is the same. Table 1-(1) and Table 1-(2) show the relationship between the thickness of a single layer of the Nb—Ti alloy film and the magnetic field shielding effect depending on the number of layers respectively. Table 1-(1) deals with Nb—Ti alloy films each of which has a thickness between 10 and 100 $\mu$m, and Table 1-(2) deals with Nb—Ti alloy films each of which has a very small thickness between 1 and 5 $\mu$m.

TABLE 1 - (1)

| Total thickness of Nb—Ti films ($\mu$m) | Thickness of a Nb—Ti alloy film (Nb 50%, T:50%) ($\mu$m) | | | |
|---|---|---|---|---|
| | Multilayer construction | | | Single-layer construction |
| | 10 | 20 | 100 | |
| 100 | Tesla 0.72 (10) | Tesla 0.385 (5) | Tesla 0.102 (1) | Tesla 0.102 (1) |
| 200 | Tesla 1.43 (20) | Tesla 0.768 (10) | Tesla 0.198 (2) | Tesla 0.157 (1) |
| 300 | Tesla 2.13 (30) | Tesla 1.14 (15) | Tesla 0.283 (3) | Tesla 0.268 (1) |

The values in parentheses represent the number of layers.

TABLE 1 - (2)

| Total thickness of Nb—Ti films ($\mu$m) | Thickness of a Nb—Ti film ($\mu$m) | | |
|---|---|---|---|
| | Multilayer construction | | Single-layer construction |
| | 2 | 5 | |
| 20 | 0.49 (10) | 0.26 (4) | Telsa 0.102 (1) |
| 40 | 0.98 (20) | 0.52 (8) | Tesla 0.157 (1) |
| 60 | 1.47 (30) | 0.78 (12) | Tesla 0.268 (1) |

The values in parentheses represent the number of layers.

TABLE 1 - (3)

| Total thickness of Nb—Ti films ($\mu$m) | Thickness of a Nb—Ti film in a single layer ($\mu$m) Additional experimental data for thinner thickness range below 2.0 $\mu$m in a single-layer of superconductor film (UNIT: $\mu$m) | | | | | | | | | |
|---|---|---|---|---|---|---|---|---|---|---|
| | 0.5 | 0.1 | 0.2 | 0.3 | 0.5 | 0.7 | 1.0 | 1.5 | 1.9 | 2.0 |
| 50 | 1.25 Tesla | 1.55 Tesla | 1.65 Tesla | 1.33 Tesla | 1.45 Tesla | 1.68 Tesla | 1.60 Tesla | 1.37 Tesla | 1.24 Tesla | 1.20 Tesla |
| 100 | 2.50 Tesla | 3.10 Tesla | 3.30 Tesla | 2.66 Tesla | 2.90 Tesla | 3.36 Tesla | 3.20 Tesla | 2.73 Tesla | 2.48 Tesla | 2.40 Tesla |
| 200 | 5.00 Tesla | 6.20 Tesla | 6.60 Tesla | 5.32 Tesla | 5.80 Tesla | 6.72 Tesla | 6.40 Tesla | 5.46 Tesla | 4.96 Tesla | 4.80 Tesla |

(Note)
1 If film thickness is less than 0.05 $\mu$m, it is difficult to prepare thin film having an equal thickness over wider scope of area.

As obviously shown in Table 1-(1), greater magnetic field shielding effect is obtained by using superconductor films each of which has a smaller thickness, provided that the total thickness is the same. This is significant when the thickness is not more than 20 μm (the thickness obtained at the turning point). This phenomenon is based on the above-mentioned two facts discovered by the inventors of the present invention. The superconductor having this kind of characteristics is especially useful when it is used to shield intense magnetic fields. Let's take a superconductor for magnetic field shielding made of multilayers of Nb—Ti alloy films having a total thickness of 300 μm as an example. In the case of the conventional superconductor three layers of 100 μm films need to be used as shown in Table 1-(1). This superconductor has a magnetic field shielding amount of 0.283 Tesla. In the case of the superconductor of the present invention, 30 layers of 10 μm Nb—Ti films are used and a magnetic field shielding amount of 2.13 Teslas is obtained. By this comparison, the effect of the superconductor of the present invention is 7.5 times as high as that of the conventional shielding Table 1-(2) deals with Nb—Ti alloy films each of which has a thickness smaller than the films dealt with in Table 1-(1).

It is understood that in the case of films each of which has a thickness of not more than 10 μm the magnetic field shielding amount significantly increases as the thickness of the film is smaller. More specifically, if 10 μm films are used to shield a magnetic flux density of approximately 1.4 teslas for example, a shielding having the total thickness of 200 μm is necessary according to Table 1-(1)). If 2 μm films are used, however, the total thickness can be reduced to 60 μm, approximately one third of the thickness required for the superconductor made of 10 μm films.

Table 1-(3) deals with Nb—Ti alloy films each of which has a thickness smaller than the films dealt with in either Table 1-(1) or Table 1-(2).

It is understood that in the case of films each of which has a thickness of not more than 2 μm, the magnetic field shielding effect significantly increases as the thickness of the film is smaller. More specifically, if 2 μm films are used to shield a magnetic flux density of approximately 1.4 Teslas, for example, a shielding having a total thickness of 60 μm is necessary (according to Table 1-(2)). If 0.5 μm films are used, however, the total thickness can be reduced to 50 μm. In addition, it should be apparent from Table 1-(3) that magnetic flux densities of vary high Teslas (greater than 5) can be achieved and that such a shielding effect cannot be achieved with the thicker layers.

These facts completely overthrow the conventionally accepted theory that thicker superconductor films should be used to shield more intense magnetic fields. It is no exaggeration to say that these discoveries of the present invention are a breakthrough in practicality.

As shown in Tables 1-(1), 1-(2) and 1-(3), the characteristics of a superconductor film can be delivered most effectively when the thickness of its layer is very thin. Therefore, the thickness of a superconductor layer should preferably be between 0.05 to 2.0 μm in actual practice. The thickness of the Nb—Ti alloy film is 20 μm at the turning point shown in FIG. 1. However, this thickness at the turning point may vary depending on the filming speed or substrate temperature in the case of sputtering even when there is no difference in the composition of Nb—Ti alloy and may also vary depending on the superconductor material used. The thickness at the turning point may reach 80 μm in some cases. The superconductor for magnetic field shielding of the present invention comprises a composite lamination of the above-mentioned superconductor film and metal layer made of aluminum or copper. The metal layer is used to stabilize (mainly cool) the superconductor film. More specifically, since the heat conductivity of the composite lamination is far greater than that of the superconductor made of the superconductor film only, the metal layer can efficiently radiate heat from the superconductor film and prevents temperature increase due to flux flow. Furthermore, the metal layer forms a current circuit in the area where transition to the normal region occurs to reduce heat generation and has a braking effect to quick magnetic flux variation such as flux jumping.

When multilayers of superconductor films are exposed to an intense magnetic field, the first layer (nearest to the magnetic field) is affected most seriously by the magnetic field. The second layer and the subsequent layers are less affected. The last layer is not affected at all. This function is possible only when all layers operate stably; for instance if a flux jumping occurs at the first layer, an abrupt magnetic field change occurs at the second layer, and thus a second flux jumping also occurs at the second layer, resulting in that the desired magnetic field shielding effect cannot be obtained. Since the superconductor for magnetic field shielding of the present invention is a composite lamination of a thin superconductor film and metal layer having the above-mentioned function, flux jumping is prevented and the superconductor layer is stabilized. Thus, the original characteristics of the superconductor layer can be fully utilized. When a single metal layer is used, a ready-made sheet is applied. When multilayers of the metal layers are used, it is better to use thin films made by thin-film forming techniques such as sputtering or vacuum evaporation for the metal layers except the bottom metal layer sheet to make the total thickness of the shielding thinner as detailed later.

Embodiments are described below.

(Embodiment 1)

(a) Preparation of Composite Laminations (a-1) Nb—Ti alloy films were formed by sputtering on commercially available aluminum foil (13 μm in thickness) to obtain six types of composite laminations comprising Nb—Ti alloy films having thicknesses of 0.95, 2.0, 4.5, 8.5, 12 and 20 μm.

(a-2) Four types of Nb—Ti alloy films having thicknesses of 100, 200, 300 and 700 μm were prepared by rolling. Their surfaces were pickled and coated with a thin solder film by ultrasonic soldering. The surface of a 1.0 mm thick copper sheet is also coated with a thin solder film. Each type of Nb—Ti alloy film was laminated with the copper sheet, and pressed and heated to obtain four types of composite laminations. These were used for comparison.

(b) Measurement of Magnetic Field Shielding Amount

The above-mentioned composite laminations were formed in discs of 47 mm in diameter. The magnetic field shielding amount was measured at the center of each disc. The measurement values are shown in FIG. 1. According to FIG. 1, it is known that the magnetic field shielding effect abruptly increases in the thickness range between nearly 0 and 20 μm (mostly 10 μm) and thereafter the increasing rate drops considerably, that is, the effect gradually increases if the thickness exceeds 20 μm.

(c) Lamination of Composite Lamination

Three types of composite laminations comprising Nb—Ti alloy films having thicknesses of 2, 10 and 20 μm, each type of which was laminated in three to ten layers.

(d) Measurement of Magnetic Flux Shielding Amount

The magnetic field shielding amounts of the multilayer composite laminations prepared as described in (c) and that of a single composite lamination were measured in the same way as described in (b). The measurement results are shown in FIG. 2. According to FIG. 2, it is known that the magnetic field shielding effect is proportional to the number of composite laminations.

According to the results shown in FIG. 2, it is understood that the multilayer composite laminations comprising Nb—Ti alloy films, each of which has a thickness of not more than 20 μm, and copper sheets have far greater magnetic field shielding effect than the multilayer composite laminations comprising Nb—Ti alloy films, each of which has a thickness of more than 20 μm, and copper sheets even when the total thickness of the former is smaller than that of the latter. Since flux jumping is prevented by the stabilization action of the copper layer, the characteristics of Nb—Ti alloy films are assured to be fully delivered.

(Embodiment 2)

(a) Preparation of Composite Laminations

NbN·TiN films were formed by sputtering Nb—Ti alloy on aluminum foil in an atmosphere of nitrogen ($N_2$) gas to obtain two types of composite laminations comprising NbN·TiN films having thicknesses of 2 and 10 μm.

(b) Measurement of Magnetic Flux Shielding Amount

The composite laminations were laminated and their magnetic field shielding amounts were measured in the same way as used for embodiment 1. The composite laminations having 1, 3 and 5 layers were measured. The measurement results are shown in Table 2.

According to Table 2, the magnetic field shielding amount of composite laminations comprising NbN·TiN films is approximately three times as high as that of composite laminations comprising Nb—Ti alloy films. In the case of bulk (ready-made films other than the films formed by thin-film forming techniques), its upper critical magnetic flux density where the superconducting effect can be maintained would be a value slightly greater than 10 Teslas at 4.2 K. from the common sense standpoint of the industry concerned. In the case of the NbN·TiN films; however, its upper critical magnetic flux density is assumed to be far greater than 10 Teslas from the commonsense standpoint of the industry concerned. Therefore, it is quite natural that the composite laminations comprising NbN·TiN films can effectively shield magnetic fields having very high flux density values.

TABLE 2

| Number of NbN.TiN films | Thickness of a NbN.TiN film (μm) | |
| --- | --- | --- |
| | 2 | 10 |
| 1 | 0.15 | 0.19 |
| 3 | 0.45 | 0.57 |
| 5 | 0.75 | 0.95 |

The composite laminations or laminated layers of the embodiments are used to repulse and concentrate magnetic lines of force. This is called "lens effect." By disposing the composite lamination(s) around a magnetic field the composite lamination(s) can shield the magnetic field on one hand and can concentrate the magnetic lines of force on the other hand so that a magnetic field having a high magnetic flux density can be taken out and used for other purposes.

Figure 3:
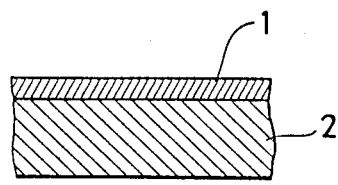
FIG. 3 is a partial vertical sectional view illustrating an embodiment of the superconductor for shielding of the present invention having a single layer of film.
Figure 4:
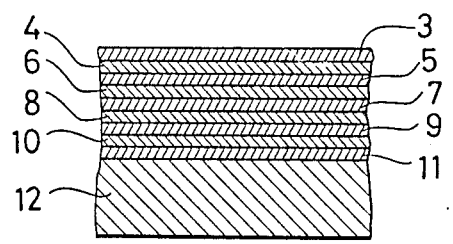
FIG. 4 is a partial vertical sectional view illustrating another embodiment of the superconductor of the present invention having multilayers.

Two constructions of the superconductor for magnetic field shielding of the present invention are detailed below referring to the drawings. FIG. 3 shows a single layer of a composite lamination and FIG. 4 shows eight layers of composite laminations. The numeral 1 is a thin film of a superconductor. The numeral 2 is a ready-made metal sheet. In FIG. 4, a metal sheet 12 is placed at the bottom. Metal layers 4, 6, 8 and 10 which are laminated alternately with the superconductor films over the metal sheet 12 are films formed by sputtering or vacuum evaporation. In this embodiment shown in FIG. 4, the metal films 4, 6, 8 and 10 are used to significantly reduce the total thickness of the 22 multilayer construction. The metal sheet 12 placed at the bottom functions as a substrate. The numerals 3, 5, 7, 9 and 11 are the superconductor films formed by thin-film forming techniques. If examples are mentioned, the metal sheet 12 is a 13 μm thick ready-made aluminum sheet, the metal films 4, 6, 8 and 10 are 2 μm thick aluminum evaporation films and the superconductor films 3, 5, 7, 9 and 11 are 2 μm thick Nb—Ti alloy evaporation films.

As described above, the superconductor for magnetic field shielding of the present invention has an effective combination of the above-mentioned magnetic field shielding characteristics which have not been known and the stabilization action of the metal layers. Thus, the superconductor for magnetic field shielding of the present invention can have a great magnetic field shielding effect even if the shielding has thin layers. If applied for various magnetic field shielding devices, it is obvious that the superconductor of the present invention can help reduce the weight and cost of such devices. Furthermore, the superconductor of the present invention can be formed more easily since it is made of thin films. It is certain that the superconductor of the present invention will be highly evaluated in many fields as a superconductor for magnetic field shielding of very high practical use.

We claim:

1. A magnetic field shield including a superconductor film having a magnetic field shielding effect which abruptly increases from the vicinity of the origin to a turning point of a graph illustrating the relationship between the thickness of a single layer of said superconductor film and the magnetic field shielding effect of said superconductor film, and after said turning point gradually increases as the thickness of said superconductor film increases, said magnetic field shield being characterized in that it comprises at least one composite lamination comprising a thin film of said superconductor, said thin film having a thickness not more than that obtained at said turning point and not less than 0.05 μm but not more than 2.0 μm.

2. A magnetic field shield according to claim 1, wherein said superconductor film is a film formed on said metal layer by thin-film forming techniques such as sputtering.

3. A magnetic field shield according to claim 1, wherein said superconductor film is closely contacted with said metal layer by ultrasonic solder.

4. A magnetic field shield according to claim 1, wherein said superconductor film is simply laminated with said metal layer without adhering means.

5. A magnetic field shield according to claim 1, 2, 3 or 4, wherein said superconductor film is made of niobium, niodium alloys, niobium compounds or vanadium compounds.

6. A magnetic field shield according to claim 1, 2, 3 or 4, wherein said metal layer is a sheet made of aluminum or copper.

7. A magnetic field shield according to claim 1, 2, 3 or 4, wherein said metal layer is a thin aluminum film or a thin copper film made by thin-film forming techniques.

8. A magnetic field shield according to claim 1, 2, 3 or 4, further comprising a plurality of said composite laminations laminated together.

9. A magnetic field shield according to claim 5, wherein said metal layer is a thin aluminum film or a thin copper film made by thin-film forming techniques.

10. A magnetic field shield according to claim 1, 2, 3 or 4, further comprising at least another composite lamination comprising a thin film of said superconductor having a thickness not more than that obtained at said turning point laminated onto said composite lamination.

11. A magnetic field shield according to claim 5, further comprising at least another compsite lamination comprising a thin film of said superconductor having a thickness not more than that obtained at said turning point laminated onto said composite lamination.

12. A magnetic field shield according to claim 6, further comprising at least another composite lamination comprising a thin film of said superconductor having a thickness not more than that obtained at said turning point laminated onto said composite lamination.

13. A magnetic field shield according to claim 7, further comprising at least another composite lamination comprising a thin film of said superconductor having a thickness not more than that obtained at said turning point laminated onto said composite lamination.

* * * * *